United States Patent
Uya

(10) Patent No.: US 7,956,392 B2
(45) Date of Patent: *Jun. 7, 2011

(54) IMAGING ELEMENT AND IMAGING DEVICE

(75) Inventor: Shinji Uya, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/103,811

(22) Filed: Apr. 16, 2008

(65) Prior Publication Data

US 2008/0265296 A1    Oct. 30, 2008

(30) Foreign Application Priority Data

Apr. 27, 2007  (JP) ................ P2007-118827

(51) Int. Cl.
*H01L 27/146* (2006.01)

(52) U.S. Cl. ........ 257/292; 257/431; 257/432; 257/444; 257/E27.133; 257/E27.134

(58) Field of Classification Search .......... 257/431, 257/292, 434, 444
See application file for complete search history.

(56) References Cited

U.S. PATENT DOCUMENTS

| 6,323,475 B1 * | 11/2001 | Spartiotis et al. | 250/208.1 |
| 7,723,663 B2 * | 5/2010 | Uya | 250/208.1 |
| 2006/0118795 A1 * | 6/2006 | Araki | 257/83 |
| 2006/0197007 A1 * | 9/2006 | Iwabuchi et al. | 250/208.1 |
| 2007/0045642 A1 * | 3/2007 | Li | 257/98 |

FOREIGN PATENT DOCUMENTS

JP    2006-148104 A    6/2006

OTHER PUBLICATIONS

Maruyama et al., "A back-illuminated high-sensitivity small-pixel color CMOS image sensor with flexible layout of metal wiring," CMOS ITE Technical Report, vol. 25, pp. 25-28.

* cited by examiner

*Primary Examiner* — Lynne A. Gurley
*Assistant Examiner* — Junghwa M Im
(74) *Attorney, Agent, or Firm* — Birch, Stewart, Kolasch & Birch, LLP.

(57) ABSTRACT

An imaging element comprises: an optical element substrate part in which the imaging element generates a signal charge by photo-electrically converting an incident light applied from one surface side of the optical element substrate part to read the signal charge from the other surface side of the optical element substrate part and picks up an image; and a CMOS circuit substrate part connected to the other surface side of the optical element substrate part so as to transfer the signal charge generated in the photoelectric conversion layer, wherein the optical element substrate part comprises: a photoelectric conversion layer to generate the signal charge by photo-electrically converting the incident light; a charge storage part that stores the signal charge; and a reading transistor that reads the signal charge stored in the charge storage part.

6 Claims, 4 Drawing Sheets

IMAGING ELEMENT AND IMAGING DEVICE

BACKGROUND OF THE INVENTION

1. Field of the Invention

The present invention relates to an imaging element and more particularly to an imaging element and an imaging device that can store a signal charge generated by a photo-electric conversion and read the signal charge at a desired timing.

2. Description of the Related Art

As the related art CMOS image sensor, a structure of a pixel equivalent circuit shown in FIG. 4 is known. As shown in FIG. 4, the CMOS image sensor uses a scanning type reading system that a signal charge generated in a photodiode is read in order one pixel by one pixel. In the case of this system, when an image of a moving object to be shot is picked up, the picked up image is disadvantageously distorted due to the shift of an exposure time between the pixel whose turn of reading is early and the pixel whose turn of reading is late in an imaging area.

To solve the disadvantage of the scanning type reading system, as disclosed in ITE Technical Report vol. 30 No. 25 pp 25-28, a method is proposed that a reading speed is increased to increase a frame rate so that the shift of an exposure time between pixels is decreased to reduce the distortion of a picked up image.

On the other hand, in a CCD image sensor, since a reset operation of a photodiode is simultaneously applied to all pixels and a reading operation from the photodiode to a charge transfer path is also substantially simultaneously carried out, the synchronization of an exposure time between the pixels is established (especially, a progressive scanning CCD). In the CMOS image sensor, as disclosed in JP-A-2006-148104, a function can be realized for temporarily storing a signal charge in a storage part and reading the signal charge at the same timing by providing the storage part having a light shielded in a pixel.

However, in the CMOS image sensor, a structure that the storage part is provided for storing the signal charge requires an element having the same electrostatic capacity as that of the photodiode for generating the signal charge. Since this structure is disadvantageous in a CMOS circuit at the time of micronizing a pixel, the structure is not ordinarily employed.

SUMMARY OF THE INVENTION

The present invention is devised by considering the above-described circumstances, and it is an object of the present invention to provide an imaging element and an imaging device that can avoid a disadvantage in the micronization of a pixel in a CMOS image sensor and use a global electronic shutter.

The above-described object of the present invention is achieved by below-described structures.

(1) An imaging element comprising: an optical element substrate part in which the imaging element generates a signal charge by photo-electrically converting an incident light applied from one surface side of the optical element substrate part to read the signal charge from the other surface side of the optical element substrate part and picks up an image; and a CMOS circuit substrate part connected to the other surface side of the optical element substrate part so as to transfer the signal charge generated in the photoelectric conversion layer, wherein the optical element substrate part comprises: a photoelectric conversion layer to generate the signal charge by photo-electrically converting the incident light; a charge storage part that stores the signal charge; and a reading transistor that reads the signal charge stored in the charge storage part.

(2) An imaging element according to the above-described (1) further comprising: an element side connecting terminal connected to the reading transistor and provided on the other surface side of the optical element substrate part for each pixel; and a circuit side connecting terminal provided on a surface of the CMOS circuit substrate part for each pixel and connected to the element side connecting terminal.

(3) An imaging element according to the above-described (1) or (2), wherein the reading transistor comprises a high concentration p layer directed toward the CMOS circuit substrate part (on the side of the CMOS circuit substrate part).

(4) An imaging element according to any one of the above-described (1) to (3), wherein the CMOS circuit substrate part comprises: a wiring layer; a stack type storage capacity part formed by using at least a part of the wiring layer; and a voltage fixing electrode that stabilizes the capacity of the storage capacity part.

(5) An imaging element according to any one of the above-described (1) to (4), wherein the CMOS circuit substrate part comprises: a charge detecting area that detects the signal charge; and a transfer transistor that transfers the signal charge to the charge detecting area are formed.

(6) An imaging device comprising: an imaging element according to the above-described (1) to (5); and a voltage applying unit that applies to the reading transistor a reading pulse of a voltage higher than a driving voltage applied to the CMOS circuit substrate part.

According to the present invention, since the charge storage part for storing the signal charge and the reading transistor for reading the signal charge are provided in the optical element substrate part, a charge storage part having a capacity larger than the charge storage capacity of a photoelectric conversion part does not need to be provided in the CMOS circuit substrate part and the high density of the CMOS circuit substrate part can be avoided from being prevented.

Further, after a reading operation by the reading transistor, since a complete transfer can be realized to completely deplete the photoelectric conversion part, the occurrence of an after-image can be prevented.

Further, since the reading operation of the charge from the photoelectric conversion part to the CMOS circuit substrate part can be carried out at the same time by uniformly controlling the reading transistor, the synchronization of the reading operation can be ensured and a high speed clock does not need to be used for the reading operation. In such a way, even when the amplitude of a voltage of a reading pulse is enhanced, a consumed electric power is not increased so much. When the optical element substrate part and the CMOS circuit substrate part can be respectively formed with separate semiconductor substrates and transistors are formed respectively in the substrate parts, the optical element substrate part can be manufactured by using a high voltage resistant process without being restricted by the operating voltage of the CMOS circuit substrate part to form the photoelectric conversion part that can be read under a high voltage. Accordingly, a quantity of saturated storage charge of the photoelectric conversion part can be greatly increased.

DETAILED DESCRIPTION OF THE INVENTION

Figure 1:
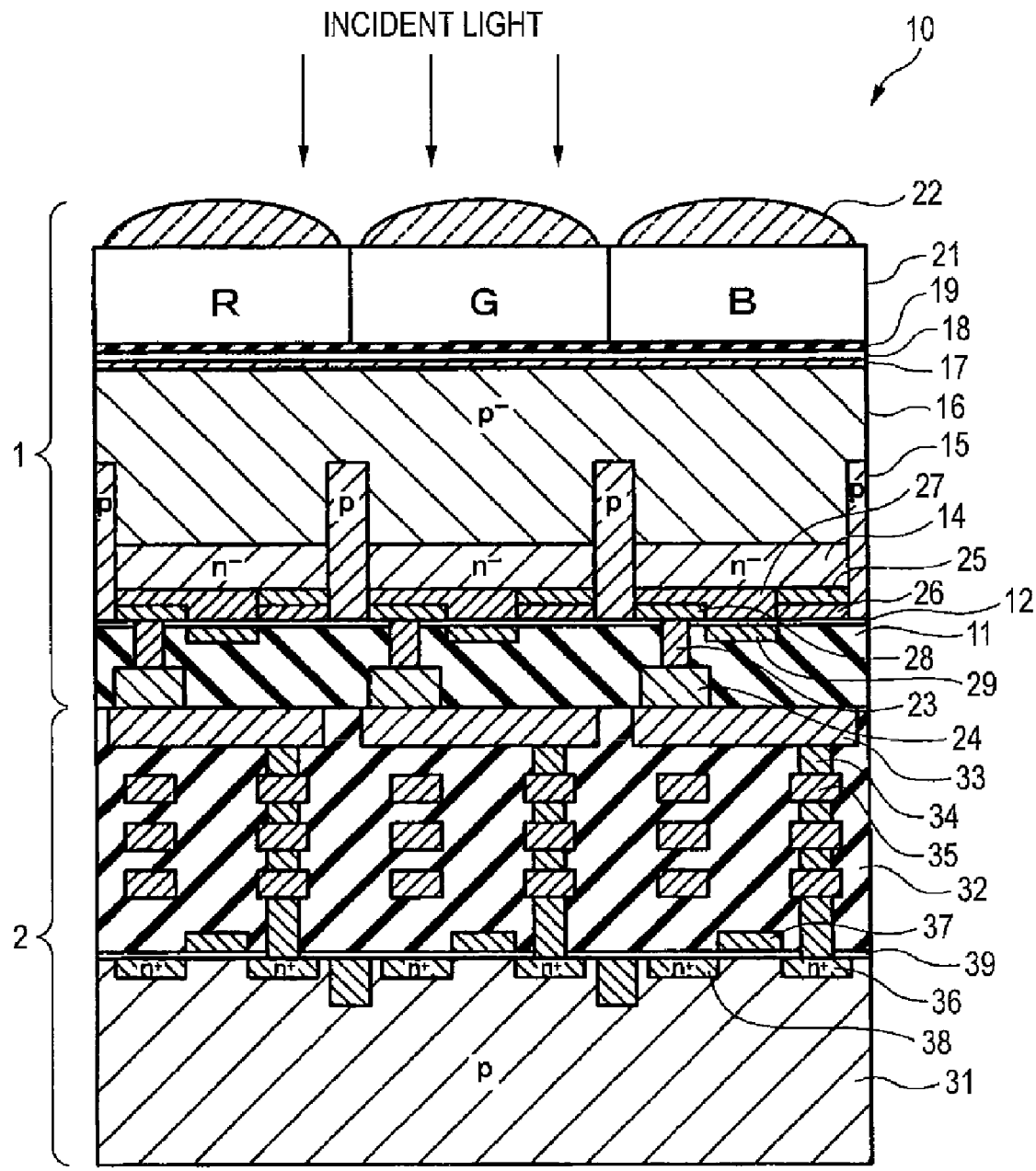
FIG. 1 is a sectional view showing the structure of an imaging element.

Now, an embodiment of the present invention will be described below in detail by referring to the drawings.

FIG. 1 is a sectional view showing the structure of an imaging element according to the present invention. The imaging element 10 according to the present invention includes an optical element substrate part 1 and a CMOS circuit substrate part 2 connected to a side of the optical element substrate part 1 opposite to a side on which a light is incident. The imaging element 10 generates a signal charge by photo-electrically converting an incident light applied from one surface side of the optical element substrate part 1 to read the signal charge from the other surface side of the optical element substrate part and pick up an image. In this embodiment, as shown in FIG. 1, the light is allowed to be incident from an upper side of the optical element substrate part 1 and the signal charge is read from a lower side of the optical element substrate part 1.

The optical element substrate part 1 is provided with a p type semiconductor substrate including a p– type silicon layer (p– layer) 16 and a p+ type silicon layer (p+ layer) 17 having an impurity concentration higher than that of the p-type silicon layer 16. The P type semiconductor substrate and an n layer 14 function as a photoelectric conversion layer for generating the signal charge in accordance with the incident light. In this embodiment, the thickness of a depletion layer of the photoelectric conversion layer is preferably 5 μm or more to 20 μm or less.

In the vicinity of the lower surface of the p type semiconductor substrate, a plurality of n– type impurity diffusion layers (n– layer) 14 are arranged in parallel with the surface. Further, in the lower part of the n– layer 14, a p type silicon layer (p layer) 27 is formed for each n– layer 14. In both sides of the n– layer 14 in the horizontal direction (right and left directions in FIG. 1), element separation areas 15 composed of a p type impurity diffusion layer are formed.

In one end area in the horizontal direction of the p layer 27, an n type silicon layer (n layer) 25 and a P+ type silicon layer (p+ layer) 26 having an impurity concentration higher than that of the n– layer 14 are laminated.

Further, in the other end part opposite to a side in which the n layer 25 and the p+ layer 26 are formed in the horizontal direction of the p layer 27, an n+ type silicon layer (n+ layer) 28 is formed that has an impurity concentration higher than that of then layer 25. Then layer 25 and the n+ layer 28 are formed on the same surface in the lower surface of the of the p layer 27.

In the lower surface of the p layer 27 (the surface on which the n layers 25 and the n+ layer 28 are formed), an insulating layer 11 is formed through a gate insulating film 12.

In an interface of the insulating film 11 near the p layer 27, a plurality of reading electrodes 29 are arranged in parallel with the surface respectively for pixels. The reading electrodes 29 are connected to a voltage applying unit not shown in the drawing so that the same voltage can be applied at the same time.

In this embodiment, the p layer 27, the n layer 25, the p+ layer 26, the n+ layer 28 and the reading electrode 29 form a reading transistor. Further, then layer 25 functions as a charge storage part (refer it also to as a charge storage part 25, hereinafter) for temporarily storing the signal charge generated in a photoelectric conversion part before the signal charge is read. According to this structure, during a driving operation, after the signal charge is stored in the charge storage part 25, a reading pulse of the same voltage is simultaneously applied to the reading electrodes 29 respectively corresponding to the pixels so that the signal charge of the charge storage part 25 can be read to the n+ layer 28.

In the insulating layer 11, a post shaped plug electrode 23 is formed that is electrically connected to the lower surface of the n+ layer 28 and vertically extended and a micro bump 24 that functions as an element side connecting terminal is formed in the end part of a lower part of the plug electrode 23. The micro bump 24 is formed to be exposed to an external part in the lower surface of the insulating layer 11.

On the upper surface of the p+ layer 17, an insulating layer 18 transparent to the incident light is formed. Further, on the upper surface of the insulating layer 18, a high refractive index layer 19 is formed that is transparent to the incident light, such as a film made of silicon nitride or carbon having a diamond structure in order to prevent the reflection of the light in the lower surface of the p type semiconductor substrate caused from the difference of a refractive index between the insulating layer 18 and the p type semiconductor substrate.

On the high refractive index layer 19, a color filter layer 21 is formed on which any one of R (red), G (green) and B (blue) is arranged in a prescribed pattern for each pixel. On the color filter 21, an upward convex lens shaped micro lens layer 22 having an upward protruding curved surface is formed. The micro lens layer 22 may not be provided and only the color filter layer 21 may be provided on the high refractive index layer 19.

The CMOS circuit substrate part 2 includes an insulating layer 32. On the upper surface of the insulating layer 32, a micro bump 33 is formed that functions as a circuit side connecting terminal connected to the micro bump 24 connected to the lower surface of the optical element substrate part 1 and exposed to the lower surface.

Further, in the insulating layer 32, are formed a plug electrode 34 electrically connected to the micro bump 33 and extended vertically and a wiring layer 35 made of aluminum or the like connected to the plug electrode 34. In the lower surface of the insulating layer 32, a semiconductor substrate 31 composed of a p type impurity diffusion layer is provided through a gate insulating film 39.

In the vicinity of the upper surface of the semiconductor substrate 31, are formed a storage area of a charge to be detected 36 composed of an n+ type impurity diffusion layer connected to the lower end part of the plug electrode 34 to temporarily store the signal charge to be detected and a charge detecting area 38 composed of an n+ type impurity diffusion layer spaced horizontally from the storage area of a charge to be detected 36. Further, on the upper surface of the gate insulating film 39, a transfer electrode 37 is formed for transferring the signal charge stored in storage area of a charge to be detected 36 to the charge detecting area 38.

In the imaging element 10 having the above-described structure, the light incident on the micro lens layer 22 passes through the color filter layer 21 and is photo-electrically converted into the signal charge in the p type semiconductor substrate and the generated signal charge is temporarily stored in the charge storage part 25. Then, the reading pulse of the same voltage is applied to the reading electrode 29 at the same time to read the signal charge of the charge storage part 25 to the n+ layer 28 at the same time respectively for all pixels. The signal charge read to the n+ layer 28 is transferred to the micro bump 24 through the plug electrode 23 and stored in the storage part of a charge to be detected 36 of the semiconductor substrate 31 of the CMOS circuit substrate part 2 through the micro bump 33 and the plug electrode 34 of the connected CMOS circuit substrate part 2. Then, a voltage is applied to the transfer electrode 37 so that the signal charge stored in the storage part of a charge to be detected 36 is transferred to the charge detecting area 38, and then, inputted to an amplifier in each pixel.

According to the present invention, since the charge storage part for storing the signal charge and the reading transistor for reading the signal charge are provided in the optical element substrate part 1, a charge storage part having a capacity larger than the charge storage capacity of a photoelectric conversion part does not need to be provided in the CMOS circuit substrate part 2 and the high density of the CMOS circuit substrate part 2 can be avoided from being prevented.

Further, after a reading operation by the reading transistor, since a complete transfer can be realized to completely deplete the photoelectric conversion part, the occurrence of an after-image can be prevented.

Further, since the reading operation of the charge from the charge storage part 25 to the n+ layer 28 and the storage part of a charge to be detected 36 can be carried out at the same time by uniformly controlling the reading transistors, the synchronization of the reading operation can be ensured and a high speed clock does not need to be used for the reading operation. In such a way, even when the amplitude of the voltage of the reading pulse is enhanced, a consumed electric power is not increased so much. When the optical element substrate part 1 and the CMOS circuit substrate part 2 can be respectively formed with separate semiconductor substrates and transistors are formed respectively in the substrate parts, the optical element substrate part 1 can be manufactured by using a high voltage resistant process without being restricted by the operating voltage of the CMOS circuit substrate part 2 to form the photoelectric conversion part that can be read under a high voltage. Accordingly, a quantity of saturated storage charge of the photoelectric conversion part can be greatly increased.

Figure 2:
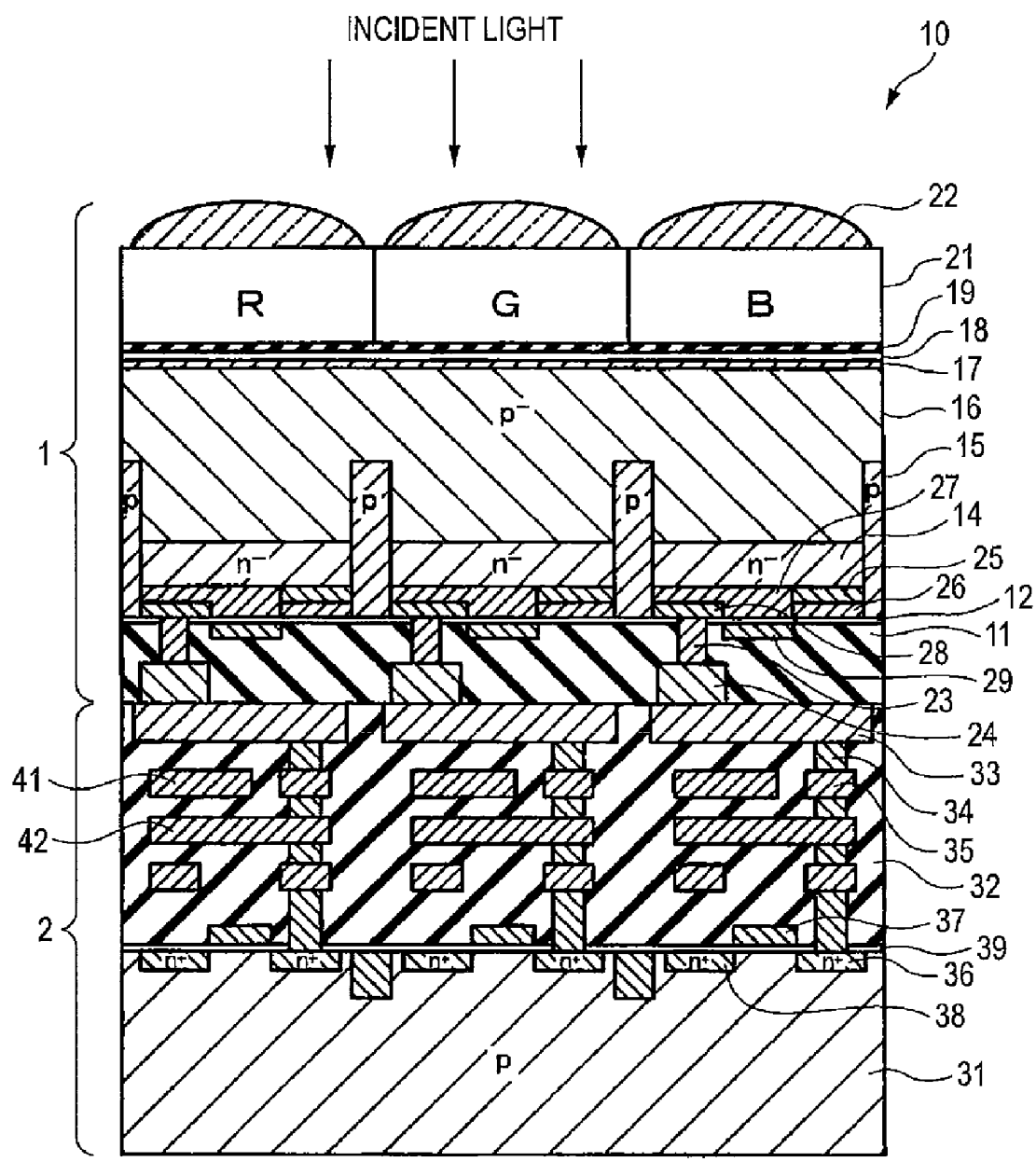
FIG. 2 is a sectional view showing other structure of the imaging element.

FIG. 2 is a sectional view showing a structure of another embodiment of an imaging element according to the present invention. In the embodiment described below, members having equal structures and operations to those of the already described members are designated by the same or corresponding reference numerals in the drawing and an explanation thereof will be simplified or omitted.

A basic structure of the imaging element 10 of this embodiment is the same as that of the above-described embodiment shown in FIG. 1. Accordingly, only different points from these of the above-described embodiment will be described below.

In the imaging element 10 having the structure shown in FIG. 2, in a CMOS circuit substrate part 2, a stack type storage capacity part 42 is formed by using at least a part of a wiring layer 35. In this structure, the storage capacity part 42 has a structure that ensures a stored charge capacity by extending a part of the wiring layer 35 in the horizontal direction. The structure of the storage capacity part 42 is not limited to a structure shown in FIG. 2 and may be suitably changed within a range where a desired charge capacity can be stored.

Further, in the CMOS circuit substrate part 2, a voltage fixing electrode 41 is provided for stabilizing the capacity of the storage capacity part 42. During driving the imaging element 10, a prescribed voltage is applied to the voltage fixing electrode 41 by a fixing voltage applying unit not shown in the drawing to maintain the voltage of the storage capacity part 42 to a constant value in accordance with the voltage of the voltage fixing electrode 41.

According to such a structure, in the storage capacity part 42, a storage capacity sufficient for storing a signal charge generated in a photoelectric conversion part of an optical element substrate part 1 can be ensured.

Figure 3:
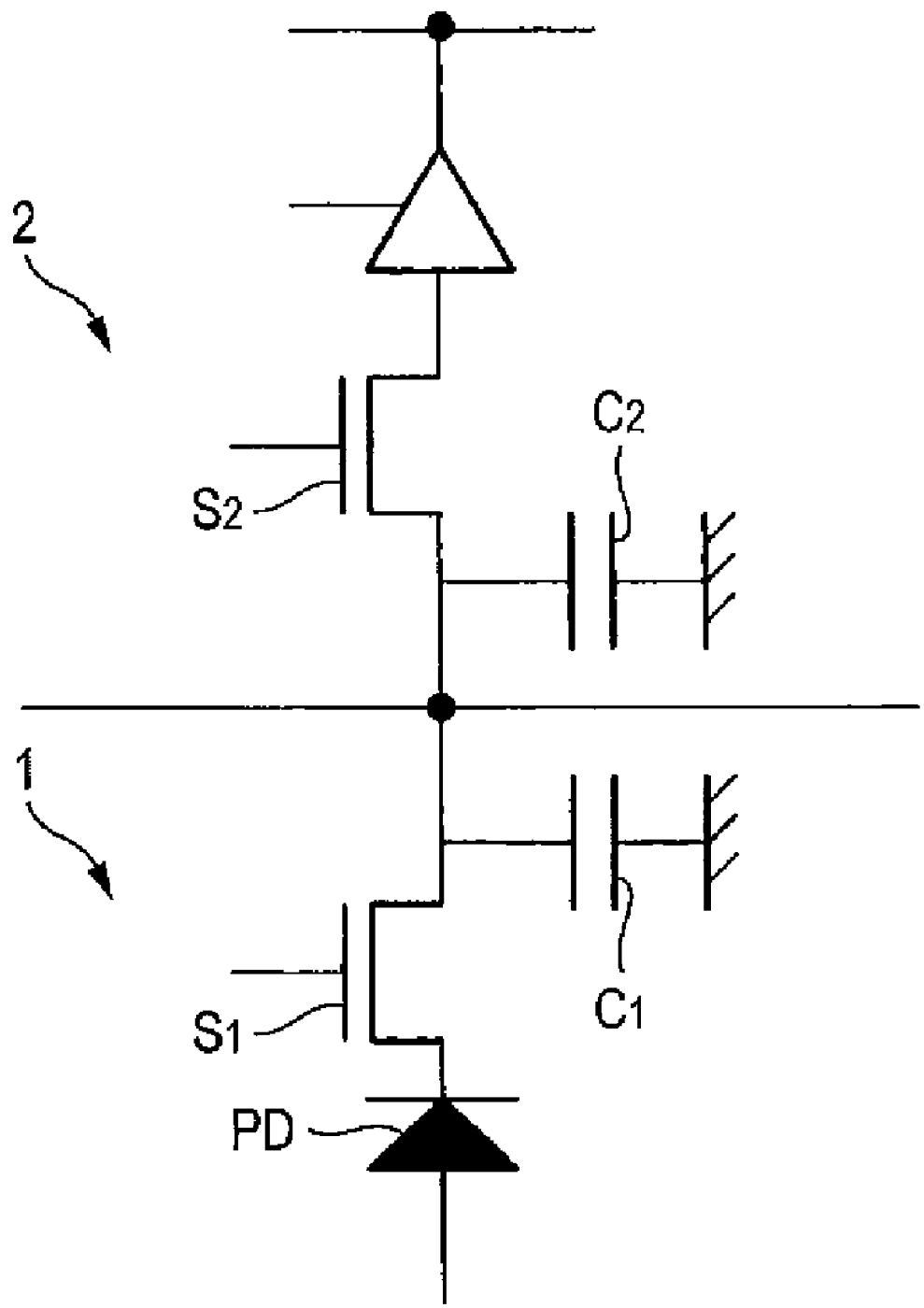
FIG. 3 is a diagram showing an equivalent circuit of a pixel unit of the imaging element.
Figure 4:
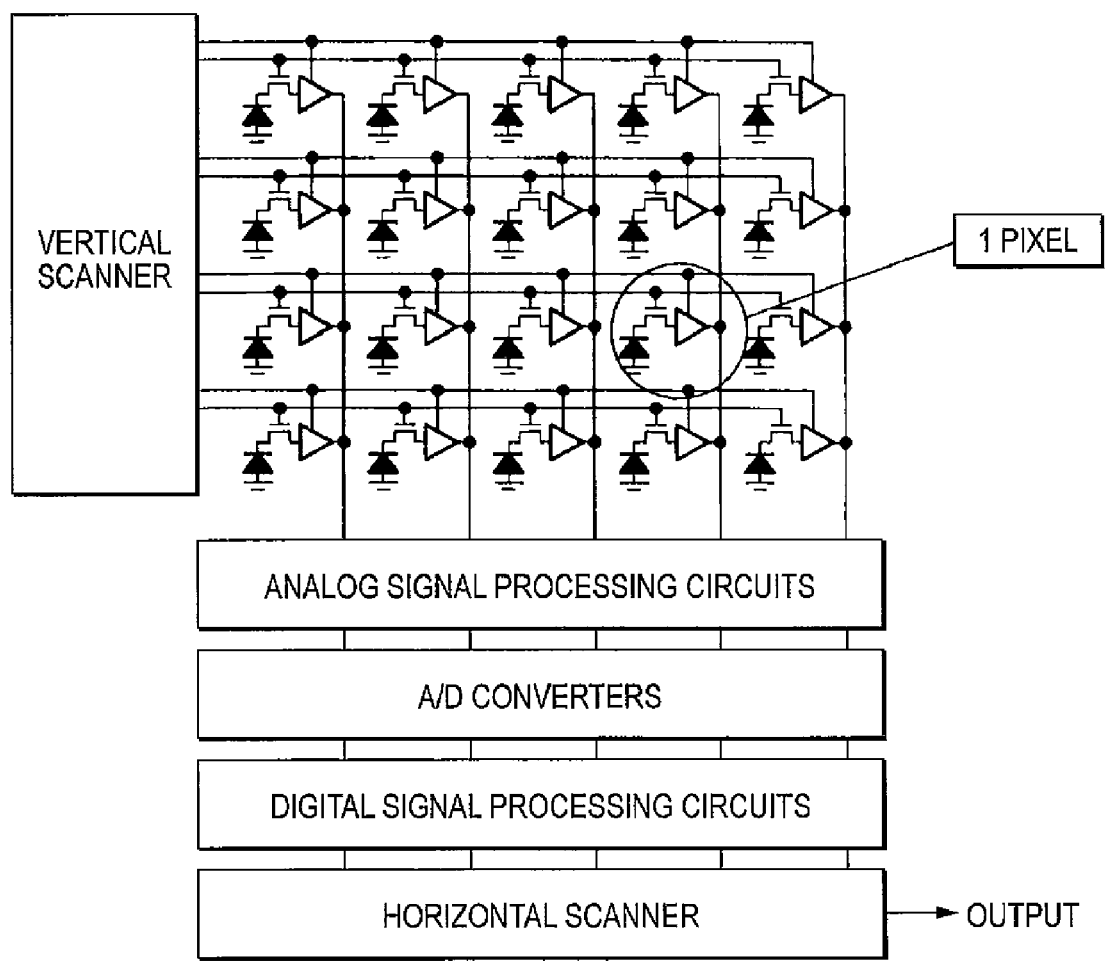
FIG. 4 is a diagram showing the structure of a pixel equivalent circuit of the related-art CMOS image sensor.

FIG. 3 is a diagram showing an equivalent circuit of a pixel unit of the imaging element according to the present invention. "PD" shown in FIG. 3 designates the photoelectric conversion part provided in the optical element substrate part 1. "$S_1$" designates a reading transistor and "$C_1$" designates an n+ layer 28. Further, "$S_2$" designates a transfer transistor provided in the CMOS circuit substrate part 2 and "$C_2$" designates a storage part of a charge to be detected 36.

An operation at the time of driving the imaging element will be described by referring to FIG. 3. When an incident light is applied to an imaging surface of the optical element substrate part 1, the signal charge is generated by the photoelectric conversion part (PD) formed in the optical element substrate part 1 and stored in a charge storage part 25. Then, a reading pulse is simultaneously applied to the reading transistor ($S_1$) between respective pixels. Then, the signal charge stored in the charge storage part 25 is read to the n+ layer 28 ($C_1$). After the signal charge is read, the n+ layer 28 functions as a storage part after reading for storing the signal charge. Further, since the optical element substrate part 1 is connected to the CMOS circuit substrate part 2 by an element side connecting terminal and a circuit side connecting terminal, a part of the signal charge is also stored in the storage part of a charge to be detected 36 ($C_2$) After that, when a voltage is applied to the transfer transistor ($S_2$), the charge stored in the n+ layer 28 ($C_1$) and the storage part of a charge to be detected 36 ($C_2$) is transferred to a charge detecting area 38 and inputted to an amplifier in the pixel.

The present invention may provide an imaging device to which the imaging element of the above-described embodiment is applied. The imaging device according to the present invention includes the imaging element 10 having an optical element substrate part 1 and a CMOS circuit substrate part 2. In a photoelectric conversion layer of the optical element substrate part 1, are formed a charge storage part 25 for storing a signal charge and a reading transistor for reading the signal charge stored in the charge storage part 25. Further, the imaging device includes a voltage applying unit such as a voltage pulse generating part for applying a reading pulse of a voltage higher than a driving voltage applied to the CMOS circuit substrate part to the reading transistor. According to the imaging device having the above-described structure, since the reading operation of the charge from the photoelectric conversion part to the CMOS circuit substrate part can be carried out at the same time by uniformly controlling the reading transistors, the synchronization of the reading operation can be ensured and a high speed clock does not need to be used for the reading operation. Accordingly, the imaging device of the present invention is preferably applied to a digital camera having a global electronic shutter.

According to the present invention, an imaging element and an imaging device can be provided that can avoid a disadvantage in the micronization of a pixel in a CMOS image sensor and use a global electronic shutter.

The entire disclosure of each and every foreign patent application from which the benefit of foreign priority has been claimed in the present application is incorporated herein by reference, as if fully set forth.

What is claimed is:

1. An imaging element comprising:
an optical element substrate part in which the imaging element generates a signal charge by photo-electrically converting an incident light applied from one surface side of the optical element substrate part to read the signal charge from the other surface side of the optical element substrate part and picks up an image, the optical element substrate part comprising:
a first insulating layer;
a photoelectric conversion layer to generate the signal charge by photo-electrically converting the incident light;
a charge storage part that stores the signal charge;
a reading transistor that reads the signal charge stored in the charge storage part; and
a plug electrode to which the signal charge read by the reading transistor is transferred, said plug electrode being formed in the first insulating layer;
a first micro bump that is connected to the plug electrode, said first micro bump being formed in the first insulating layer; and
a CMOS circuit substrate part connected to the other surface side of the optical element substrate part so as to transfer the signal charge generated in the photoelectric conversion layer, the CMOS circuit substrate part comprising:
a second insulating layer;
a second micro bump that contacts with the first micro bump of the optical element substrate part, said second micro bump being formed in the second insulating layer;
wherein the plug electrode of the optical element substrate part is connected to the second micro bump of the CMOS circuit substrate part,
the signal charge transferred to the plug electrode is further transferred to the second micro bump, and
the first micro bump is smaller in size than the second micro bump.

2. The imaging element according to claim 1, further comprising:
an element side connecting terminal connected to the reading transistor and provided on the other surface side of the optical element substrate part for each pixel; and
a circuit side connecting terminal provided on a surface of the CMOS circuit substrate part for each pixel and connected to the element side connecting terminal.

3. The imaging element according to claim 1, wherein the reading transistor comprises a high concentration p layer directed toward the CMOS circuit substrate part.

4. The imaging element according to claim 1, wherein the CMOS circuit substrate part comprises:
a wiring layer;
a stack type storage capacity part formed by using at least a part of the wiring layer; and
a voltage fixing electrode that stabilizes the capacity of the storage capacity part.

5. The imaging element according to claim 1, wherein the CMOS circuit substrate part comprises:
a charge detecting area that detects the signal charge; and
a transfer transistor that transfers the signal charge to the charge detecting area are formed.

6. The imaging device comprising:
an optical element substrate part in which the imaging element generates a signal charge by photo-electrically converting an incident light applied from one surface side of the optical element substrate part to read the signal charge from the other surface side of the optical element substrate part and picks up an image, the optical element substrate part comprising:
a first insulating layer;
a photoelectric conversion layer to generate the signal charge by photo-electrically converting the incident light;
a charge storage part that stores the signal charge;
a reading transistor that reads the signal charge stored in the charge storage part; and
a plug electrode to which the signal charge read by the reading transistor is transferred, said plug electrode being formed in the first insulating layer;
a first micro bump that is connected to the plug electrode, said first micro bump being formed in the first insulating layer; and
a CMOS circuit substrate part connected to the other surface side of the optical element substrate part so as to transfer the signal charge generated in the photoelectric conversion layer, the CMOS circuit substrate part comprising:
a second insulating layer;
a second micro bump that contacts with the first micro bump of the optical element substrate part, said second micro bump being formed in the second insulating layer;
wherein the plug electrode of the optical element substrate part is connected to the second micro bump of the CMOS circuit substrate part,
the signal charge transferred to the plug electrode is further transferred to the second micro bump, and
the first micro bump is smaller in size than the second micro bump; and
a voltage applying unit that applies to the reading transistor a reading pulse of a voltage higher than a driving voltage applied to the CMOS circuit substrate part.

* * * * *